United States Patent [19]

Nakata

[11] 3,959,621
[45] May 25, 1976

[54] THERMALLY SENSITIVE SWITCH DEVICE
[75] Inventor: Jōsuke Nakata, Itami, Japan
[73] Assignee: Mitsubishi Denki Kabushiki Kaisha, Tokyo, Japan
[22] Filed: Sept. 16, 1974
[21] Appl. No.: 506,050

[30] Foreign Application Priority Data
Sept. 26, 1973 Japan............................. 48-108114
Sept. 26, 1973 Japan............................. 48-108115
Nov. 9, 1973 Japan............................. 48-126448
Nov. 15, 1973 Japan............................. 48-128846

[52] U.S. Cl. ............................... 219/501; 219/494
[51] Int. Cl.² ......................................... H05B 1/02
[58] Field of Search .......... 219/490, 494, 501, 504, 219/505, 497, 498, 507, 482

[56] References Cited
UNITED STATES PATENTS
3,524,968  8/1970  Walsh .............................. 219/501 X
3,564,205  2/1971  Tyler .............................. 219/501 X
3,708,696  1/1973  Lorenz ............................ 219/501

Primary Examiner—Mark O. Budd
Assistant Examiner—Fred E. Bell
Attorney, Agent, or Firm—Wenderoth, Lind & Ponack

[57] ABSTRACT

A main thyristor is serially connected to a load across an AC source. A thermally sensitive thyristor is connected at the anode to the anode of the main thyristor through a resistor and at the cathode to the gate electrode of the main thyristor and responds to an ambient temperature exceeding a predetermined magnitude to be conducting. When conducting, the thyristor switches the main thyristor to its ON state. Alternatively, the anode of the thyristor may be connected to the junction of two series resistors connected across the anode and cathode of the main thyristor. The conducting thyristor turns the main thyristor off.

12 Claims, 9 Drawing Figures $T_S > T_3 > T_2 > T_1$

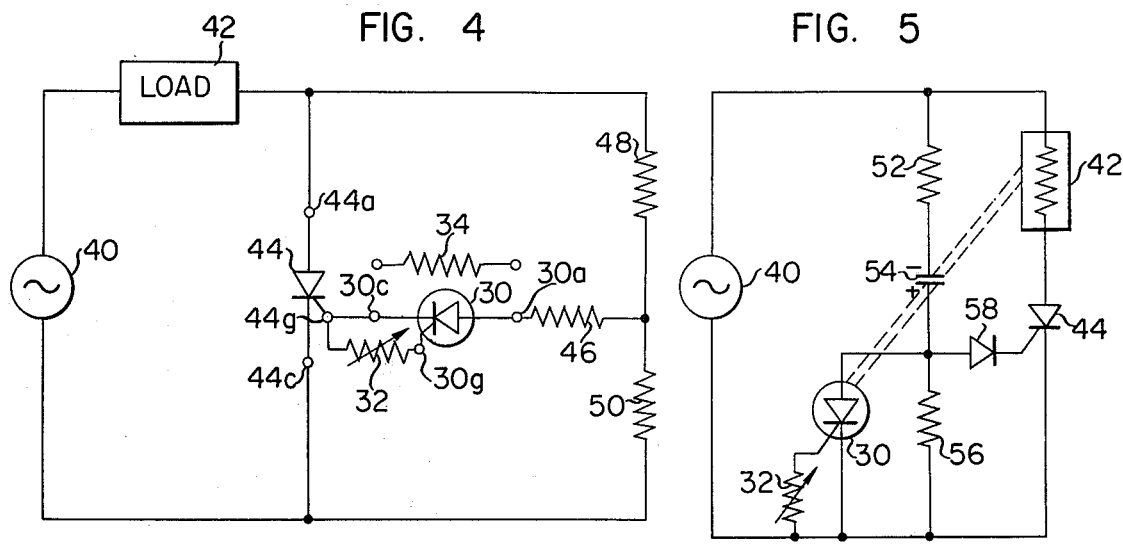
FIG. 4
FIG. 5
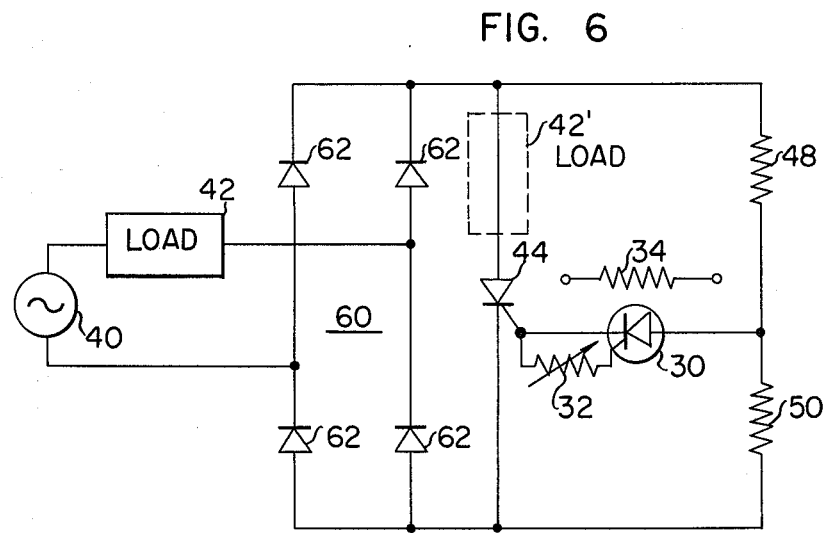
FIG. 6
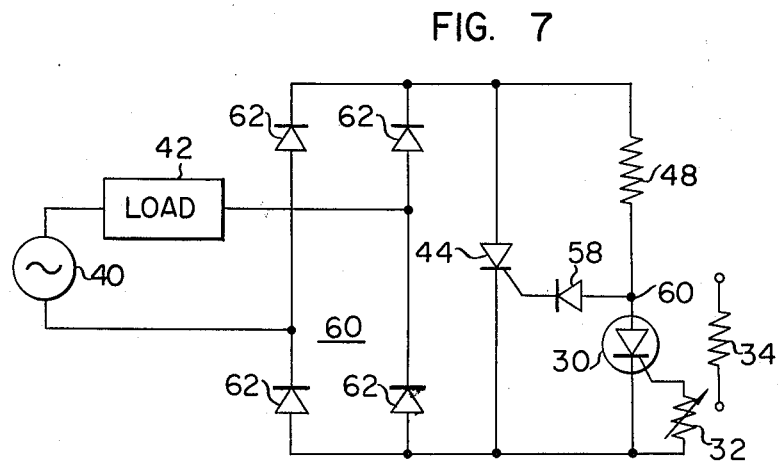
FIG. 7

THERMALLY SENSITIVE SWITCH DEVICE

BACKGROUND OF THE INVENTION

This invention relates to an electronic, thermally sensitive switch device responsive to an ambient temperature in excess of a predetermined magnitude to perform the switching operation.

Heretofore, there have been widely employed switches including metallic contacts such as bimetal switches, mercury thermostat switches etc. Those switches have encountered problems in wear and tear and chattering of the contacts, transient voltages and impulsive sound developed upon switching, low switching speeds etc. As a result, such switches have limited application as a thermally sensitive switch. On the other hand, there are known thermistors which act as a thermally sensitive resistance element and also thermally sensitive switches utilizing a thermistor. Since the thermistor itself has no ability to turn currents on and off, it has been required to operatively associate the thermistor with resistors to form a resistance bridge having the thermistor disposed on one arm thereof, while the resistance bridge is electrically connected to a differential amplifier subsequently coupled to a transisterized switch. This has led to the disadvantages that the resulting devices are complicated in construction and become expensive.

SUMMARY OF THE INVENTION

Accordingly it is an object of the present invention to provide a new and improved electronic thermally sensitive switch device eliminating the necessity of using a complicated circuit.

It is another object of the present invention to provide a new and improved electronic thermally sensitive switch device which has good thermal response.

It is still another object of the present invention to provide a new and improved electronic thermally sensitive switch device for performing the switching operation at a null magnitude of the source voltage.

The present invention accomplishes those objects by the provision of an electronic thermally sensitive switch device comprising a main thyristor including a cathode electrode, an anode electrode and a gate electrode, the cathode and anode electrodes being connected across a source of electric power through a load, and a thermally sensitive thyristor including a cathode electrode, an anode electrode and a gate electrode, the cathode and anode electrodes being connected between a selected one of the cathode and anode electrodes of the main thyristor and the gate electrode of the latter, the thermally sensitive thyristor being brought into its conducting state at a junction temperature thereof in excess of a predetermined magnitude, the main thyristor performing the operation of switching the load under control of the conduction of the thermally sensitive thyristor.

Preferably, the thermally sensitive thyristor may have connected across the gate and cathode electrodes thereof a variable resistor for controlling the junction temperature thereof at which the main thyristor performs the switching operation.

Advantageously, the thermally sensitive thyristor may be thermally coupled to a heat source or to the load.

In order to supply a gate triggering current to the main thyristor, the thermally sensitive thyristor may have the cathode electrode connected to the gate electrode of the main thyristor and the anode electrode connected to at least the anode electrode of the main thyristor.

Alternatively the thermally sensitive thyristor may have the cathode electrode connected to the cathode electrode of the main thyristor and the anode electrode connected to at least the gate electrode of the main thyristor, whereby a gate triggering current supplied to the main thyristor is bypassed through the thermally sensitive thyristor in its conducting state.

BRIEF DESCRIPTION OF THE DRAWINGS

The present invention will become more readily apparent from the following detailed description taken in conjunction with the accompanying drawings in which:

FIG. 1b is the equivalent circuit for the externally heated, thermally sensitive thyristor shown in FIG. 1a;

FIG. 2b is a graph illustrating the relationship between a break-over voltage and a junction temperature for the thermally sensitive thyristor shown in FIG. 1a;

FIGS. 4 through 7 are circuit diagrams of different embodiments of the present invention.

DESCRIPTION OF THE PREFERRED EMBODIMENTS

For a better understanding the nature of the present invention, thermally sensitive thyristors used with the present invention will now be described in conjunction with the fundamental structure and operation thereof.

Like conventional thyristors, thermally sensitive thyristors have a pnpn or npnp four layer structure including a pair of main electrodes disposed in ohmic contact with a pair of the outermost layers forming emitter regions, and a gate electrode disposed in ohmic contact with at least one intermediate layer.

Figure 1A:
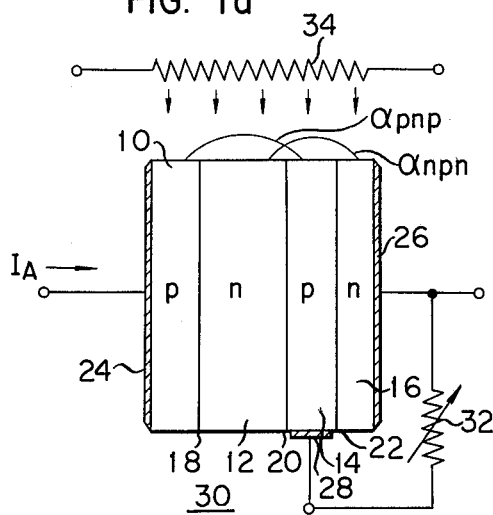
FIG. 1a is a schematic diagram of a the structure of a thermally sensitive thyristor used with the present invention.

FIG. 1a shows one type of structure of a thermally sensitive thyristor. The arrangement illustrated comprises a p type first emitter layer 10, an n type first base layer 12, a p type second base layer 14 and an n type second emitter layer 16 superposed on one another in the named order to form a first, a second and a third pn junction 18, 20 and 22 respectively therebetween. An anode electrode 24 is disposed in ohmic contact with the first emitter layer 10, a cathode electrode 26 is disposed in ohmic contact with the second emitter layer 16, and a gate electrode 28 is disposed in ohmic contact with the second base layer 14. The thermally sensitive thyristor thus formed is generally designated by the reference numeral 30. A variable resistor 32 is connected across the cathode and gate electrodes 26 and 28 respectively for the purpose as will be apparent hereinafter. A heat source may be disposed adjacent the thermally sensitive thyristor 30 to be thermally coupled thereto. In the latter event, the thyristor is of the indirectlyheated type. The heat source is shown in FIG. 1 as being an electrically heated resistor 34.

Figure 1B:
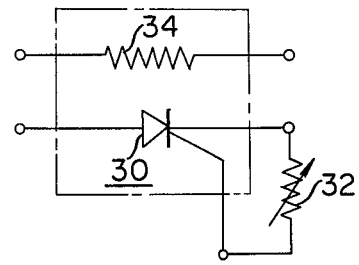

The indirectly-heated type thermally sensitive thyristor 30 may be represented by an equivalent circuit as shown in FIG. 1b wherein like reference numerals designate the components identical to those shown in FIG. 1a.

The thermally sensitive thyristor may have a structure including five layers of alternate conductively, or a pnpnp or an npnpn five layer structure. Such thyristors can be switched in each of the forward and reverse directions.

Figure 2A:
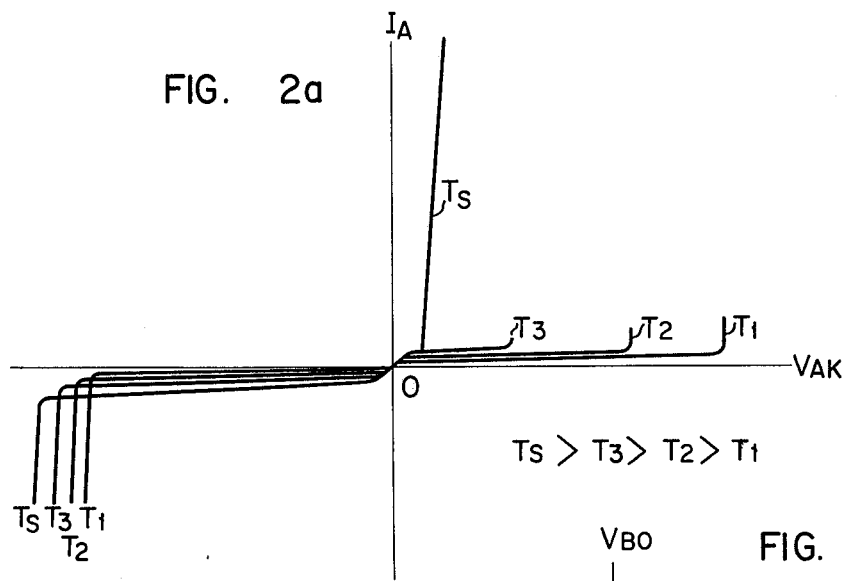
FIG. 2a is graph illustrating the anode-to-cathode voltage-current characteristic of the thermally sensitive thyistor shown in FIG. 1a with a junction temperature thereof being the parameter.

Thermally sensitive thyristors such as shown in FIG. 1a have an anode-to-cathode voltage-current characteristic as shown in FIG. 2a. In FIG. 2a wherein a principal current $I_A$ flowing through the anode and cathode electrodes 24 and 26 respectively is plotted as the ordinate against a voltage $V_{AK}$ across those electrodes as the abscissa, the voltage-to-current characteristics are illustrated with a thermally sensitive thyristor having a junction temperatures $T_j$ successively raised to $T_1$, $T_2$, $T_3$ and $T_s$ where $T_1 < T_2 < T_3 < T_s$.

As shown in the first quadrant in FIG. 2a, the thermally sensitive thyristor has a forward voltage-to-current characteristic including a stable ON state and a stable OFF state as long as the junction temperature thereof is sufficiently low. The term "forward" means that the anode electrode is higher in potential than the cathode electrode. In the OFF state an extremely low leakage current is permitted only to flow through the thyristor until a voltage applied thereacross reaches a certain limit. If a voltage applied across the thyristor exceeds a threshold voltage thereof then the so-called break-over phenomenon occurs by which the thyristor switches from its OFF to its ON state. This threshold voltage is called a break-over voltage or an OFF-state voltage ability.

In the ON state, however, the thermally sensitive thyristor has a very low impedance and is responsive to a slight voltage applied thereacross to cause a flow of heavy current therethrough. That voltage is called an ON-state voltage and that current is called an ON-state current. Once the tyristor has been transferred to its ON state, the ON state is maintained and the OFF state is not restored unless the ON-state current decreases to a certain magnitude. A minimum current for maintaining the ON state is called a "holding current."

If a voltage is applied in the reverse direction (in which the cathode electrode has a higher potential than the anode electrode) thereacross, the thermally sensitive thyristor exhibits the reverse voltage-to-current characteristic such as shown in the third quadrant in FIG. 2a. That characteristic permits only a slight leakage current to flow in the reverse direction through the thyristor until a limited voltage is reached, and resembles the reverse voltage-to-current characteristic exhibited by reverse blocking thyristors and semiconductor rectifier diodes. That limited voltage is called a reverse breakdown voltage. If the reverse breakdown voltage exceeds a certain limit then the thermally sensitive thyristor may be thermally destroyed.

The transfer of the thermally sensitive thyristor from its OFF to its ON state as above described is accomplished by means for heating the thyristor to raise its temperature.

From FIG. 2a it is seen that the thermally sensitive thyristor has its break-over voltage decreased with an increase in its junction temperature.

However the break-over phenomenon does not occur in thermally sensitive thyristors at temperatures exceeding a certain limit. That is, when put at such temperatures, thermally sensitive thyristors exhibit a voltage-to-current characteristic which does not include the OFF state. This voltage-to-current characteristic includes the ON-state alone and has the same curve as the forward characteristic of pn junction diodes. A minimum junction temperature at and above which the OFF state is not developed is called herein a switching temperature designated by $T_s$ in FIG. 2a or 2b.

Figure 2B:
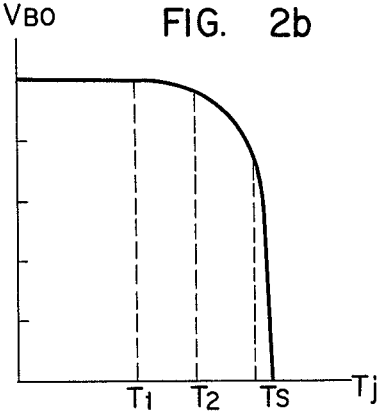

FIG. 2b shows the break-over voltage $V_{BO}$ potted as the ordinate against the junction temperature $T_j$ for a typical thermally sensitive thyristor, and therefore the junction temperature-dependency of the break-over voltage. Junction temperatures $T_1$, $T_2$, $T_3$ and $T_s$ shown in FIG. 2b correspond to the temperatures $T_1$, $T_2$, $T_3$ and $T_s$ illustrated in FIG. 2a. As shown in FIG. 2b, the break-over voltage starts to decrease at $T_1$ and suddenly drops at temperatures above $T_3$ until the OFF state disappears at the switching temperature $T_s$.

The junction temperature-dependency of the break-over voltage of thermally sensitive thyristors is also variable with the magnitude of resistance connected across the cathode and gate electrodes thereof. More specifically, with the parallel resistance infinitely high or with the gate electrode in its open state, the particular thermally sensitive thyristor has its characteristic switching temperature as determined by the type of semiconductive material forming the thyristor and a junction structure. As of semiconductive resistance decreases, the switching temperature is higher than that characteristic value. Therefore a variable resistor, such as shown at 32 in FIG. 1a, connected across a gate and a cathode electrode of the particular thermally sensitive thyristor can vary in the magnitude of resistance to adjust the switching temperature thereof. As an example, the switching temperature can be adjusted between about 75° and 175°C for a thermally sensitive thyristor formed of silicon.

It is recalled that, upon the switching temperature being reached, thermally sensitive thyristors have the forward voltage-to-principal current characteristic in which the OFF state disappears while only the ON state appears.

That status in which only the ON state is present occurs due to the fact that a leakage current (or an OFF-state current) through the pnpn junction is considerably increased through the thermal generation of carriers which, in turn, cooperates with an increase in the lifetime of the carriers to increase current amplification factors $\alpha$pnp and $\alpha$npn of npn pnp and npn transistor portions (see FIG. 1a) until the sum of the $\alpha$pnp and $\alpha$npm is equal to or greater than unity. From this it will be appreciated that the characteristic switching temperature of thermally sensitive thyristors greatly depends upon the relationship between the temperature and leakage current, between the temperature and current amplification factor and between the current and current amplification factor. Accordingly thermally sensitive thyristors can be manufactured by properly selecting the type of semiconductive material, the lifetime of carriers, the impurity concentration, the impurity distribution, and the thickness of individual semiconductor layers etc. depending on the required switching temperature.

In order to return thermally sensitive thyristors from their ON state back to thier OFF state or to turn them off, it is required to return the junction temperature back to a temperature less than the switching temperature while returning the ON-state current back to a current less than the holding current. It is noted that the holding current substantially approximates a null value adjacent the switching temperature.

Thus thermally sensitive thyristors may be called combined temperature sensor and switch elements utilizing the pnpn structure. As compared with thermistors previously employed as thermally sensitive elements, such thyristors have a pnpn structure with a very high impedance in the OFF state and very low impedance in the ON state. Moreover, it is only necessary that the semiconductor element involved be thin and have a small area with respect to the required current capacity. This results in an advantage that a thermally sensitive switch having a small thermal time constant can readily be provided. Also thermally sensitive thyristors are superior to thermistors in that the uniform characteristic can be easy to be consistently yielded and the secular change can be very small as in conventional thyristors and transistors.

The present invention contemplates to provide novel thermally sensitive switch devices employing the thermally sensitive thyristor such as above described.

Figure 3:
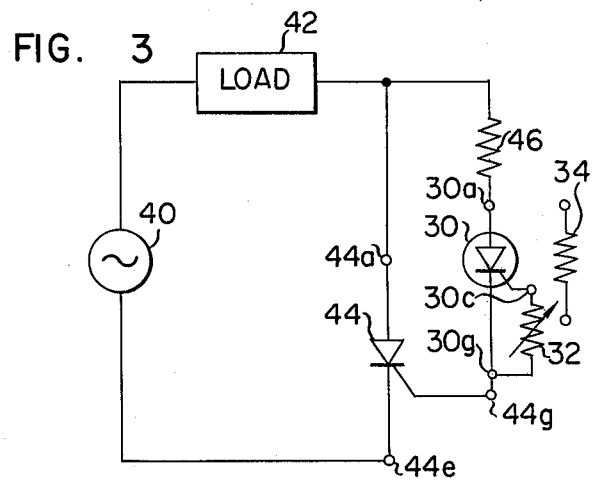
FIG. 3 is a circuit diagram of a thermally sensitive switch device constructed in accordance with the principles of the present invention.

Referring now to FIG. 3, there is illustrated a thermally sensitive switch device constructed in accordance with the principles of the present invention. The arrangement illustrated comprises a source 40 of alternating current, a load 42 and a main thyristor 44 serially interconnected in the named order to form a main circuit. The main thyristor 44 includes an anode terminal 44a connected to the load 42, a cathode terminal 44e connected to the source 40 and a gate terminal 44g connected to a thermally sensitive thyristor 30 at the cathode terminal 30g. The thermally sensitive thyristor 30 is identical to that above described in conjunction with FIGS. 1 and 2 and includes an anode terminal 30a connected to a protective resistor 46 subsequently connected to the load 42 and also to the anode terminal 44a. The thermally sensitive thyristor 30 has a variable resistor 32 connected across the cathode and gate terminals 30g and 30c thereof and a heat source 34 shown as being a resistor to heat the same. The serially connected thyristor 30 and the protective resistor 46 form a gate circuit for the main thyristor 44.

The variable resistor 32 and the heat source 34 are operative in the same manner as the corresponding components as shown in FIG. 1a. The protective resistor 46 is preliminarily selected to have a magnitude of resistance sufficient to apply to the gate electrode of the main thyristor 44 a gate current sufficient to trigger the main thyristor 44 to its conduction state with a low anode voltage when the thermally sensitive thyristor 30 is turned on as well as restricting the peak value of the gate current to a permissible value thereof or less.

In the arrangement of FIG. 3, the closure of the source 40 causes the source voltage to be applied across the anode and cathode terminals 44a and 44e of the main thyristor 44 and also a voltage substantially equal to the source voltage to be applied across the anode and cathode terminals 30a and 30g of the thermally sensitive thyristor 30.

Then the thermally sensitive thyristor 30 is heated by the heat source 34 to increase its temperature. During this heating the thermally sensitive thyristor 30 has its break-over voltage or blocking voltage suddenly decreased from some temperature until it is conducting at a time point where the applied voltage exceeds the decreasing break-over voltage. At that time, a gate triggering current flows into the gate electrode of the main thyristor 44 through the protective resistor 46 to turn the main thyristor 44 on.

The conduction of the main thyristor 44 causes a current in each positive half cycle of the source voltage to flow through the load 42 until the thermally sensitive thyristor 30 is returned to a temperature at which the break-over voltage becomes higher than the forward voltage applied thereacross.

In FIG. 4 wherein like reference numerals designate components identical to those shown in FIG. 3 there is illustrated a modification of the present invention wherein the gate circuit for the main thyristor is modified to handle a relatively high voltage. The arrangement is different from that shown in FIG. 3 only in that in FIG. 4, a pair of combined protective and voltage dividing resistors 48 and 50 serially interconnected are connected across the anode and cathode electrodes 44a and 44c of the main thyristor 44 while the series combination of the thermally sensitive thyristor 30 and the protective resistor 46 is connected across the junction of the resistors 48 and 50 and the gate terminal 44g of the main thyristor 44.

The arrangement of FIG. 4 is advantageous in that a voltage applied across the thermally sensitive thyristor 30 in its OFF state can be determined by both the magnitude of the source voltage and the ratio of magnitude of resistance between the resistors 48 and 50. Thus the voltage applied across the thyristor 30 can be decreased by increasing the ratio of voltage division provided by the resistors 48 and 50 and the arrangement is applicable to loads operative with sources of alternating current having a relatively high voltage.

FIG. 5 wherein like reference numerals designate components identical or similar to those shown in FIG. 3 illustrates another modification of the present invention forming a circuit for automatically controlling a load temperature. As in the arrangement of FIG. 3, a source 40 of alternating current has connected thereacross a series combination of a load 42 such as an electric heater and a main thyristor 44 to form a main circuit. A resistor 52, a triggering capacitor 54 and another resistor 56 are serially connected across the series combination of the load 42 and the main thyristor 44 to form a circuit for supplying to the gate electrode of the main thyristor 44 a gate triggering current with a leading phase relative to the source voltage. Then the junction of the capacitor 54 and the resistor 56 is connected to the gate electrode of the main thyristor 44 through a semiconductor diode 58 while a thermally sensitive thyristor 30 with a variable resistor 32 is connected across the resistor 56 and also put in thermally close coupling with the load 42 as shown by the double dot line in FIG. 5.

The diode 58 is so poled that a current from the said junction flows toward the gate electrode of the main thyristor 44 and serves to increase the gate triggering voltage as viewed at the junction of the capacitor 54 and the resistor 56 while decreasing the current tending to flow into the gate electrode of the main thyristor 44 in accordance with a voltage drop across the thermally sensitive thyristor 30 in its conducting state, to a magnitude less than that of the gate triggering current for the main thyristor 44, through the utilization of a threshold voltage of the diode.

When the thermally sensitive thyristor 44 is formed of germanium or silicon, the diode 58 may be formed of single silicon diode or any suitable number of silicon diodes serially connected to one another. Alternatively the diode 58 may be formed of semiconductive gallium arsenide having a higher threshold voltage than silicon.

The thermally sensitive thyristor 44 is connected at the cathode electrode to the source 40 and at the anode electrode to the junction of the capacitor 54 and the resistor 56 with the variable resistor 32 connected across the gate and cathode electrode thereof.

The operation of the arrangement shown in FIG. 5 will now be described. It is assumed that the source 40 is closed with the load or heater 42 maintained at a sufficiently low temperature thereby to keep the thermally sensitive thyristor 30 in its OFF state. Under the assumed condition, the capacitor 54 is charged with the polarity illustrated through a current path traced from the source 40 through the resistor 52, the capacitor 54, the resistor 56 and thence to the source during a negative half cycle of the source voltage in which the main thyristor 44 has the cathode electrode higher in potential than the anode electrode. Assuming that a time constant as determined by the resistors 52 and 56 and the capacitor 54 is sufficiently smaller than a time interval corresponding of the half cycle of the source voltage, the capacitor 54 is discharged adjacent the beginning of the next positive half cycle thereof, resulting in the triggering of the main thyristor 44 to its conducting state. Thus a current with a waveform of the substantially complete half cycle of the source voltage continues to flow through the load 42.

As a result, the temperature of the load 42 is raised with time and therefore the thermally sensitive thyristor 30 continues to increase in temperature until it reaches its switching temperature as above described. At that time, the thermally sensitive thyristor 30 is triggered to its conducting state to bypass the gate triggering current for the main thyristor 44 therethrough. Thus the gate triggering current terminates its flow into the gate electrode of the main thyristor 44 and then the main thyristor 44 is turned off through the inversion of the polarity of the source voltage.

As the main thyristor 44 is in its OFF state during the conduction of the thermally sensitive thyristor 30, the load 42 terminates its increase in temperature and begins to decrease in temperature. Thus the temperature of the thermally sensitive thyristor 30 drops to the switching temperature or less, whereupon the thyristor 30 returns to its forward OFF state and is turned off within one half cycle of the source voltage after it has reached the switching temperature and due to the inversion of the polarity of the source voltage. Thus the thyristor 30 is prevented from bypassing the gate triggering current therethrough. Immediately the main thyristor 44 is triggered to its conducting state adjacent the beginning of the next positive half cycle of the source voltage to permit a current to again flow through the load 42. Thereafter the main thyristor 44 repeats the ON and OFF operations around the switching temperature of the thermally sensitive thyristor 30 to maintain the temperature of the load 42 substantially constant.

As previously described, the switching temperature of the thermally sensitive thyristor 30 is variable in accordance with the conditions for biasing the gate electrode relative to the cathode electrode thereof and the magnitude of resistance connected across those two electrodes. In the arrangement of FIG. 5, the variable resistor 32 connected across the gate and cathode electrodes of the thermally sensitive thyristor 30 is adapted to adjust the switching temperature of the thyristor 30. For example, the switching temperature is steadily raised as the magnitude of resistance of the variable resistor 32 decreases. It has been found that, with the thermally sensitive thyristor 30 formed of silicon, the switching temperature thereof can be adjusted between 180° to 70°C with a magnitude of the variable resistor 32 varying from 0 to 10 megohms. Also with the thermally sensitive thyristor 30 formed of germanium, the switching temperature thereof is adjustable within a range of from 40° to 80°C.

FIG. 6 wherein like reference numerals designate the components identical to those shown in FIG. 4 illustrates an arrangement similar to that shown in FIG. 4 excepting that in FIG. 6 the main thyristor 44 and therefore the thermally sensitive thyristor 30 is connected across rectifier means. As shown in FIG. 6, a full-wave rectifier bridge generally designated by the reference numeral 60 includes four semiconductor diodes 62 and has a pair of alternating current input terminals connected across a series combination of the source 40 and the load 42 and a pair of direct current output terminals connected across the main thyristor 44.

With the thermally sensitive thyristor 30 having its junction temperature maintained sufficiently low, the same interrupts the gate triggering current for the main thyristor 44 to maintain the latter in its OFF state. Thus hardly any current flows through the load 42.

On the other hand, the thermally sensitive thyristor 30 is heated by the heat source 34 to decrease the break-over voltage until it is conducting.

Since the voltage dividing resistor 48 has a sufficiently low magnitude of resistance as previously described, the main thyristor 44 has applied thereto a gate triggering current in each half cycle of the rectified source voltage from the output terminals of the rectifier bridge 60 sufficient to trigger the same to its conducting state. This results in large flow of current through the load 42.

As above described, when the break-over voltage of the thermally sensitive thyristor 30 is decreased below the particular voltage applied across the thyristor because of an increase in temperature thereof, the thyristor 30 is conducting due to the break-over thereof. With the junction temperature of the thermally sensitive thyristor 30 equal to or higher than the switching temperature, the wave form of load current has a maximum conduction angle.

The current flowing through the thermally sensitive thyristor 30 becomes null for every half cycle of the source voltage but as long as the temperature of the thyristor 30 is maintained sufficiently high, the thyristor repeats its conducting state as it stands. However if the temperature of the thermally sensitive thyristor 30 is decreased to a temperature at which the break-over voltage is higher than the particular voltage applied thereacross then it enters its OFF state in the next cycle of the source voltage whereupon the gate triggering current for the main thyristor and therefore the load current is interrupted.

The gate triggering circuit as shown in FIG. 6 can be modified as illustrated in FIG. 7. As shown, thermally sensitive thyristor 30 identical to that illustrated in FIG. 6 is serially connected to a voltage dividing resistor 48 across the anode and cathode electrodes of the main thyristor 44 and the junction of the two components 30 and 48 is connected to the gate electrode of the main thyristor 44 through a semiconductor diode 58 identical in operation to the diode 58 as shown in FIG. 5. In other respects, the arrangement is identical to that shown in FIG. 5 and like reference numerals have been employed to identify the components identical to those illustrated in FIG. 6.

Assuming that the thermally sensitive thyristor 30 is maintained at a temperature below the switching temperature thereof, a voltage at the positive output terminal of the rectifier bridge 60 is initiated to rise from a null magnitude whereupon a gate triggering current flows into the gate electrode of the main thyristor 44 through the diode 58 to turn the main thyristor 44 on with a low voltage applied across the latter. As long as the thermally sensitive thyristor 30 is not in its conducting state, the main thyristor 44 is triggered to its conducting state for each half cycle of the source voltage to cause a flow of alternating current through the load 42. As in the previous arrangemets, the thermally sensitive thyristor 30 is heated by the heat source 34 to reach the switching temperature as determined by the variable resistor 32. At that time, the gate triggering current flowing into the gate electrode of the main thyristor 44 is bypassed to the cathode electrode thereof through the thermally sensitive thyristor 30 in its conducting state. Then the main thyristor 44 is turned off with a null ON-state current and within one half cycle of the source voltage after the thyristor 30 has reached the switching temperature. Thereafter the main thyristor 44 can not be triggered to its conducting state even though a voltage applied thereacross is raised.

As the heat source 34 decreased in temperature, the thermally sensitive thyristor 30 senses this decrease in temperature. When the junction temperture of the thermally sensitive thyristor 30 reaches a temperature just below the switching temperature, the thyristor 30 is turned off within one half cycle of the source voltage after it has reached such a temperature. This results in the main thyristor 44 being turned on.

In this way both the main thyristor 44 and the thermally sensitive thyristor 30 are turned on and off with a null voltage and one of the two is in its ON state while the other is in its OFF state.

The arrangements shown in FIGS. 6 and 7 may be modified to energize direct current loads. To this end, the load 42 is connected in series circuit relationship with the main thyristor 44 on the side of the direct current output of the rectifier bridge 60, as shown at dotted block 42' in FIG. 6.

The present invention has several advantages. For example, because of the utilization of a novel switch element called a thermally sensitive thyristor, a temperature sensor and a switch are formed into a single unit. The resulting circuit is very simplified and the number of components used is decreased, as compared with the prior art practice. Since the thermally sensitive thyristor is a switch utilizing the pn junction unlike the thermistor, it is has a high impedance ratio between the OFF and ON states thereof resulting in a stable switching operation. Also it is possible to make the thyristor essentially small-sized and therefore the thyristor can rapidly increase in temperature after having been heated. That is, it has a good thermal response. Further due to the association of the thermally sensitive thyristor with a main thyristor, the thermally sensitive thyristor has a very low power consumption and also a low self-heating effect. Thus it is possible to manufacture switch devices capable of handling relatively high load currents. In addition, because of the use of thyristors, the thermally sensitive switch device includes no contact and is always brought into its OFF state with a null voltage resulting in no occurrence of overvoltages due to the switching of contacts as well as no consumption of the contacts.

The thermally sensitive switch devices of the present invention have a variety of applications where the switching operation is required to be performed at a predetermined temperature or higher to operate loads. For example, it is applicable to operate a cooling apparatus or signal an alarm provided that a temperature of a controlled component involved exceeds a predetermined magnitude.

While the present invention has been illustrated and described in conjunction with several preferred embodiments thereof it is to be understood that numerous changes and modifications may be resorted to without departing from the spirit and scope of the present invention. For example, the thermally sensitive thyristor may be thermally coupled to the associated load in the arrangements as above described wherein it is shown as being heated by the heat source 34 and vice versa. Alternatively the heat source may be formed of a resistor substantially equal in thermal characteristics thereto and connected in a circuit with the load. That resistor is then thermally coupled to the thermally sensitive thyristor to feed the temperature of the load back to the thyristor. Also a gate triggering current may be applied to the main thyristor from a separate source of gate current for providing a trigger pulse at a zero value of the source voltage but not from the source for the main circuit.

What is claimed:

1. A thermally sensitive switch device comprising a main thyristor including a cathode electrode, an anode electrode and a gate electrode, a source of electric power and a load connected in series, said cathode electrode and said anode electrode being connected across the source of electric power and the load, and a thermally sensitive thyristor including a cathode electrode, an anode electrode and a gate electrode, said cathode and said anode electrodes of said thermally sensitive thyristor being connected between a selected one of said cathode and anode electrodes of said main thyristor and said gate electrode of the latter, said thermally sensitive thyristor being brought into its conducting state at a junction temperature thereof in excess of a predetermined magnitude, said main thyristor performing the operation of switching the load under control of the conduction of said thermally sensitive thyristor.

2. A thermally sensitive switch device as claimed in claim 1, wherein said thermally sensitive thyristor is thermally coupled to said load to control the temperature of said load through the switching operation of said main thyristor.

3. A thermally sensitive switch device as claimed in claim 1 wherein said thermally sensitive thyristor has said cathode electrode connected to said gate electrode of said main thyristor and said anode electrode connected to at least said anode electrode of said main thyristor, whereby a gate triggering current is supplied to said main thyristor through said thermally sensitive thyristor in its conducting state.

4. A thermally sensitive switch device as claimed in claim 1 wherein said thermally sensitive thyristor has said cathode electrode connected to said cathode electrode of said main thyristor and said anode electrode connected to at least said gate electrode of said main thyristor, whereby a gate triggering current supplied to said main thyristor is bypassed through said thermally sensitive thyristor in its conducting state.

5. A thermally sensitive switch device as claimed in claim 1 further comprising a variable resistor connected across said gate and said cathode electrodes of said thermally sensitive thyristor for controlling said junction temperature thereof at which said main thyristor performs the switching operation.

6. A thermally sensitive switch device as claimed in claim 1 further comprising a heat source for heating said thermally sensitive thyristor.

7. A thermally sensitive switch device comprising a main thyristor including a cathode electrode, and an anode electrode and a gate electrode, a source of alternating current and a load connected in series, said cathode electrode and said anode electrode being connected across said source of alternating current and said load, a thermally sensitive thyristor including an anode electrode, a cathode electrode, and a gate electrode, said cathode electrode of said thermally sensitive thyristor being connected to said gate electrode of said main thyristor, a resistor, said anode electrode of said thermally sensitive thyristor being connected to said anode electrode of said main thyristor through said resistor, said thermally sensitive thyristor being brought into its conducting state at a junction temperature thereof in excess of a predetermined magnitude, and a variable resistor connected across said gate and said cathode electrodes of said thermally sensitive thyristor to control said predetermined junction temperature, whereby a gate triggering current is supplied to said main thyristor through said thermally sensitive thyristor in its conducting state.

8. A thermally sensitive switch device as claimed in claim 7 further comprising a voltage dividing resistor connected across said anode and said cathode electrodes of said main thyristor, said anode electrode of said thermally sensitive thyristor being connected to an intermediate point of said voltage dividing resitor.

9. A thermally sensitive switch device comprising a main thyristor including a cathode electrode, an anode electrode and a gate electrode, a source of alternating current and a load connected in series, said cathode electrode and said anode electrode being connected across said source of alternating current and said load, a first resistor, a triggering capacitor connected across said anode and said gate electrodes of said main thyristor through said first resistor, a second resistor connected across said gate and said cathode electrodes of said main thyristor to form a circuit for charging the triggering capacitor with said first resistor and said triggering capacitor, a thermally sensitive thyristor including a cathode electrode connected to said cathode electrode of said main thyristor, an anode electrode connected to said gate electrode of said main thyristor and a gate electrode, said thermally sensitive thyristor being brought into its conducting state at a junction temperature thereof in excess of a predetermined magnitude, and a variable resistor connected across said gate and said cathode electrodes of said thermally sensitive thyristor to control said predetermined junction temperature, whereby a gate triggering current supplied to said main thyristor is bypassed through said thermally sensitive thyristor in its conducting state.

10. A thermally sensitive switch device as claimed in claim 9 further comprising a semiconductor diode connected at the cathode electrode thereof to said gate electrode of said main thyristor and at the anode electrode thereof to the junction of said second resistor and said anode electrode of said thermally sensitive thyristor.

11. A thermally sensitive switch device comprising a main thyristor including a cathode electrode, an anode electrode and a gate electrode, a rectifier means, said cathode and said anode electrodes being connected across said rectifier means, a thermally sensitive thyristor including an anode electrode, a cathode electrode and a gate electrode, said cathode electrode of said thermally sensitive thyristor being connected to said gate electrode of said main thyristor, said anode electrode of said thermally sensitive thyristor being a voltage dividing resistor connected across said cathode and said anode electrodes of said main thyristor, connected to an intermediate point on said voltage dividing resistor, said thermally sensitive thyristor being brought into its conducting state at a junction temperature thereof in excess of a predetermined magnitude, and a variable resistor connected across said gate and said cathode electrodes of said thermally sensitive thyristor to control said predetermined junction temperature, whereby a gate triggering current is supplied to the main thyristor through said thermally sensitive thyristor in its conducting state.

12. A thermally sensitive switch device comprising a main thyristor including a cathode electrode, an anode electrode and a gate electrode, a rectifier means, said cathode and said anode electrodes being connected across said rectifier means, a thermally sensitive thyristor including an anode electrode, a cathode electrode and a gate electrode, said cathode electrode of said thermally sensitive thyristor being connected to said cathode electrode of said main thyristor, a resistor, said anode electrode of said thermally sensitive thyristor being connected to said anode electrode of said main thyristor through said resistor, said thermally sensitive thyrsitor being brought into its conducting state at a junction temperature thereof in excess of a predetermined magnitude, and a variable resistor connected across said gate and said cathode electrodes of said thermally sensitive thyristor, and a unidirectional diode connected across the anode electrode of said thermally sensitive thyristor and the gate electrode of said main thyristor for supplying a gate triggering current to said main thyristor, whereby the gate triggering current is bypassed through said thermally sensitive thyristor in its conducting state.

* * * * *